(12) United States Patent
Swift et al.

(10) Patent No.: US 7,250,340 B2
(45) Date of Patent: Jul. 31, 2007

(54) METHOD OF FABRICATING PROGRAMMABLE STRUCTURE INCLUDING DISCONTINUOUS STORAGE ELEMENTS AND SPACER CONTROL GATES IN A TRENCH

(75) Inventors: Craig T. Swift, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 173 days.

(21) Appl. No.: 11/188,584

(22) Filed: Jul. 25, 2005

(65) Prior Publication Data

US 2007/0020845 A1    Jan. 25, 2007

(51) Int. Cl.
*H01L 21/336* (2006.01)

(52) U.S. Cl. ............. 438/259; 438/257; 438/593; 438/298; 438/315

(58) Field of Classification Search ........ 438/257–259, 438/593–594; 257/309–316
See application file for complete search history.

(56) References Cited

U.S. PATENT DOCUMENTS

| | | | |
|---|---|---|---|
| 4,860,070 A | 8/1989 | Arimoto et al. | |
| 5,705,415 A | 1/1998 | Orlowski et al. | |
| 5,721,448 A | 2/1998 | Hauf et al. | |
| 5,824,580 A | 10/1998 | Hauf et al. | |
| 5,914,523 A | 6/1999 | Bashir et al. | |
| 5,969,383 A | 10/1999 | Chang et al. | |
| 6,074,954 A | 6/2000 | Lill et al. | |
| 6,121,148 A | 9/2000 | Bashir et al. | |
| 6,307,782 B1 | 10/2001 | Sadd et al. | |
| 6,320,784 B1 | 11/2001 | Muralidhar et al. | |
| 6,330,184 B1 | 12/2001 | White et al. | |
| 6,399,441 B1 | 6/2002 | Ogura et al. | |
| 6,583,466 B2 | 6/2003 | Lin et al. | |
| 6,674,120 B2 | 1/2004 | Fujiwara | |
| 6,706,599 B1 | 3/2004 | Sadd et al. | |
| 6,803,620 B2 * | 10/2004 | Moriya et al. | 257/298 |
| 6,818,512 B1 | 11/2004 | Hsieh | |
| 6,894,339 B2 | 5/2005 | Fan et al. | |
| 6,916,715 B2 | 7/2005 | Hsiao et al. | |
| 6,936,887 B2 | 8/2005 | Harari et al. | |
| 7,015,537 B2 | 3/2006 | Lee et al. | |
| 7,098,502 B2 | 8/2006 | Mathew et al. | |

(Continued)

OTHER PUBLICATIONS

Osabe, et al. "Charge-Injection Length in Silicon Nanocrystal Memory Cells," VLSI, p. 242, 2004.

(Continued)

*Primary Examiner*—Dung A. Le (57) ABSTRACT

A method of fabricating a semiconductor storage cell that includes first and second source/drain regions underlying first and second trenches defined in a semiconductor substrate. Sidewalls of the trenches are lined with a charge storage stack that includes a layer of discontinuous storage elements (DSEs), which are preferably silicon nanocrystals. Spacer control gates are located in the trenches adjacent to the charge storage stacks on the trench sidewalls. The trench depth exceeds the spacer height so that a gap exists between a top of the spacers and the top of the substrate. A continuous select gate layer overlies the first trench. The gap facilitates ballistic programming of the DSEs adjacent to the gap by accelerating electrons traveling substantially perpendicular to the trench sidewalls. The storage cell may employ hot carrier injection programming to program a portion of the DSEs proximal to the source/drain regions.

20 Claims, 9 Drawing Sheets

U.S. PATENT DOCUMENTS

| | | |
|---|---|---|
| 2002/0151136 A1 | 10/2002 | Lin et al. |
| 2003/0062565 A1 | 4/2003 | Yamazaki et al. |
| 2003/0068864 A1 | 4/2003 | Park et al. |
| 2004/0000688 A1 | 1/2004 | Harari et al. |
| 2004/0121540 A1 | 6/2004 | Lin |
| 2004/0248371 A1 | 12/2004 | Wang |
| 2005/0037576 A1 | 2/2005 | Chen et al. |
| 2005/0148173 A1 | 7/2005 | Shone |
| 2005/0259475 A1 | 11/2005 | Forbes |
| 2005/0280089 A1 | 12/2005 | Forbes |
| 2005/0280094 A1 | 12/2005 | Forbes |
| 2006/0011966 A1* | 1/2006 | Wang .................. 257/315 |
| 2006/0152978 A1 | 7/2006 | Forbes |
| 2006/0166443 A1 | 7/2006 | Forbes |

OTHER PUBLICATIONS

Ma, et al. "A Dual-Bit Split-Gate EEPROM (DSG) Cell in Contactless Array for Single-Vcc High Density Flash Memories," IEDM, p. 57-60, 1994.

"Twin MONOS Cell with Dual Control Gates," VLSI Technology, Source-Side Injection Cell with Two Storage Regions Forming in Nitride, p. 122, 2000.

"Vertical Floating-Gate 4.5/sup 2/split-gate NOR Flash Memory at 110nm Node," VLSI Technology, Source-Side Injection Cell in a Trench, p. 72, 2004.

U.S. Appl. No. 10/961,295, filed Oct. 8, 2004.
U.S. Appl. No. 11/079,674, filed Mar. 14, 2005.
U.S. Appl. No. 11/188,615, filed Jul. 25, 2005.
U.S. Appl. No. 11/188,583, filed Jul. 25, 2005.
U.S. Appl. No. 11/188,585, filed Jul. 25, 2005.
U.S. Appl. No. 11/188,582, filed Jul. 25, 2005.
U.S. Appl. No. 11/188,588, filed Jul. 25, 2005.
U.S. Appl. No. 11/188,591, filed Jul. 25, 2005.
U.S. Appl. No. 11/188,603, filed Jul. 25, 2005.
U.S. Appl. No. 11/188,604, filed Jul. 25, 2005.
U.S. Appl. No. 11/188,909, filed Jul. 25, 2005.
U.S. Appl. No. 11/188,898, filed Jul. 25, 2005.
U.S. Appl. No. 11/188,910, filed Jul. 25, 2005.
U.S. Appl. No. 11/188,935, filed Jul. 25, 2005.
U.S. Appl. No. 11/188,939, filed Jul. 25, 2005.
U.S. Appl. No. 11/188,953, filed Jul. 25, 2005.
U.S. Appl. No. 11/188,999, filed Jul. 25, 2005.
U.S. Appl. No. 11/525,747, filed Sep. 22, 2006.

Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.

Hayashi, Y., et al. "Twin MONOS Cell with Dual Control Gates," 2000 Symposium on VLSI Technology Digest of Technical Papers, pp. 122-123, 2000.

Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.

Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.

U.S. Appl. No. 11/626,768, filed Jan. 24, 2007.
U.S. Appl. No. 11/626,762, filed Jan. 24, 2007.
U.S. Appl. No. 11/626,753, filed Jan. 24, 2007.

* cited by examiner

BALLISTIC SSI PROGRAM/ERASE TABLE (FOR DEVICE OF FIG. 10)

| OPERATION | CG 140-1 | CG 140-2 | SG 148 | S/D 112-1 | S/D 112-2 | WELL 102 |
|---|---|---|---|---|---|---|
| INJECTION REGION 114-1 | $V_{P2}$ | $V_{P2}$ | $V_{P3}$ | $V_{P1}$ | $V_{P4}$ | $V_{P4}$ |
| INJECTION REGION 114-2 | $V_{P2}$ | $V_{P2}$ | $V_{P3}$ | $V_{P4}$ | $V_{P1}$ | $V_{P4}$ |
| ERASE | $V_{E1}$ | $V_{E1}$ | X | X | X | $V_{E2}$ |
|  |  |  |  |  |  |  |

$V_{P1}$= 5 V  $V_{P3}$= 6 V  $V_{E1}$= -6 V  X=No Connect
$V_{P2}$= 8 V  $V_{P4}$= 0 V  $V_{E2}$= 6 V

HCI PROGRAM/ERASE TABLE (FOR DEVICE OF FIG. 10)

| OPERATION | CG 140-1 | CG 140-2 | SG 148 | S/D 112-1 | S/D 112-2 | WELL 102 |
|---|---|---|---|---|---|---|
| INJECTION REGION 114-3 | $V_{P6}$ | $V_{P6}$ | $V_{P7}$ | $V_{P5}$ | $V_{P4}$ | $V_{P4}$ |
| INJECTION REGION 114-4 | $V_{P6}$ | $V_{P6}$ | $V_{P7}$ | $V_{P4}$ | $V_{P5}$ | $V_{P4}$ |
| ERASE | $V_{E1}$ | $V_{E1}$ | X | X | X | $V_{E2}$ |
|  |  |  |  |  |  |  |

$V_{P5}$= 5 V  $V_{P7}$= 8 V  $V_{E1}$= -6 V  X=No Connect
$V_{P6}$= 8 V  $V_{P4}$= 0 V  $V_{E2}$= 6 V

BALLISTIC SSI PROGRAM/ERASE TABLE (FOR DEVICE OF FIG. 11)

| OPERATION | CG 140-1 | CG 140-2 | SG 148-1 | SG 148-2 | S/D 112-1 | S/D 112-2 | DIFF 152 | WELL 102 |
|---|---|---|---|---|---|---|---|---|
| PROGRAM BIT 114-1 | $V_{P2}$ | X | $V_{P3}$ | X | $V_{P1}$ | X | $V_{P4}$ | $V_{P4}$ |
| PROGRAM BIT 114-2 | X | $V_{P2}$ | X | $V_{P3}$ | X | $V_{P1}$ | $V_{P4}$ | $V_{P4}$ |
| ERASE BITS 114-1, -2 | $V_{E1}$ | $V_{E1}$ | X | X | X | X | X | $V_{E2}$ |

$V_{P1}$= 5 V   $V_{P3}$= 6 V   $V_{E1}$= -6 V   X=No Connect $V_{P2}$= 8 V   $V_{P4}$= 0 V   $V_{E2}$= 6 V

HCI PROGRAM/ERASE TABLE (FOR DEVICE OF FIG. 11)

| OPERATION | CG 140-1 | CG 140-2 | SG 148-1 | SG 148-2 | S/D 112-1 | S/D 112-2 | DIFF 152 | WELL 102 |
|---|---|---|---|---|---|---|---|---|
| PROGRAM BIT 114-1 | $V_{P6}$ | X | $V_{P7}$ | X | $V_{P5}$ | X | $V_{P4}$ | $V_{P4}$ |
| PROGRAM BIT 114-2 | X | $V_{P6}$ | X | $V_{P7}$ | X | $V_{P5}$ | $V_{P4}$ | $V_{P4}$ |
| ERASE BITS 114-1, -2 | $V_{E1}$ | $V_{E1}$ | X | X | X | X | $V_{E2}$ | $V_{E2}$ |

$V_{P5}$= 5 V   $V_{P7}$= 8 V   $V_{E1}$= -6 V   X=No Connect $V_{P6}$= 8 V   $V_{P4}$= 0 V   $V_{E2}$= 6 V

BALLISTIC SSI PROGRAM/ERASE TABLE (FOR DEVICE OF FIG. 12)

| OPERATION | CG 140-1 | CG 140-2 | SG 148 | S/D 112-1 | S/D 112-2 | DIFF 152-1 | DIFF 152-2 | WELL 102 |
|---|---|---|---|---|---|---|---|---|
| PROGRAM BIT 114-1 | $V_{P2}$ | X | $V_{P3}$ | $V_{P1}$ | X | $V_{P4}$ | X | $V_{P4}$ |
| PROGRAM BIT 114-2 | X | $V_{P2}$ | $V_{P3}$ | X | $V_{P1}$ | $V_{P4}$ | X | $V_{P4}$ |
| PROGRAM BIT 114-5 | $V_{P2}$ | X | $V_{P3}$ | $V_{P1}$ | X | X | $V_{P4}$ | $V_{P4}$ |
| PROGRAM BIT 114-6 | X | $V_{P2}$ | $V_{P3}$ | X | $V_{P1}$ | X | $V_{P4}$ | $V_{P4}$ |
| ERASE ALL BITS 114 | $V_{E1}$ | $V_{E1}$ | X | X | X | X | X | $V_{E2}$ |

$V_{P1}$= 5 V    $V_{P3}$= 6 V    $V_{E1}$= -6 V    X=No Connect
$V_{P2}$= 8 V    $V_{P4}$= 0 V    $V_{E2}$= 6 V

HCI PROGRAM/ERASE TABLE (FOR DEVICE OF FIG. 12)

| OPERATION | CG 140-1 | CG 140-2 | SG 148 | S/D 112-1 | S/D 112-2 | DIFF 152-1 | DIFF 152-2 | WELL 102 |
|---|---|---|---|---|---|---|---|---|
| PROGRAM BIT 114-3 | $V_{P6}$ | X | $V_{P7}$ | $V_{P5}$ | X | $V_{P4}$ | X | $V_{P4}$ |
| PROGRAM BIT 114-4 | X | $V_{P6}$ | $V_{P7}$ | X | $V_{P5}$ | $V_{P4}$ | X | $V_{P4}$ |
| PROGRAM BIT 114-7 | $V_{P6}$ | X | $V_{P7}$ | $V_{P5}$ | X | X | $V_{P4}$ | $V_{P4}$ |
| PROGRAM BIT 114-8 | X | $V_{P6}$ | $V_{P7}$ | X | $V_{P5}$ | X | $V_{P4}$ | $V_{P4}$ |
| ERASE ALL BITS 114 | $V_{E1}$ | $V_{E1}$ | X | X | X | X | X | $V_{E2}$ |

$V_{P5}$= 5 V    $V_{P7}$= 8 V    $V_{E1}$= -6 V    X=No Connect
$V_{P6}$= 8 V    $V_{P4}$= 0 V    $V_{E2}$= 6 V

METHOD OF FABRICATING PROGRAMMABLE STRUCTURE INCLUDING DISCONTINUOUS STORAGE ELEMENTS AND SPACER CONTROL GATES IN A TRENCH

RELATED APPLICATION

The subject matter of the following applications, including this application, is related: Swift and Chindalore, *Programmable Structure Including Discontinuous Storage Elements and Spacer Control Gates in a Trench*, Ser. No. 11/188,585, filed Jul. 25, 2005 and Swift and Chindalore, *Method of Fabricating Programmable Structure Including Discontinuous Storage Elements and Spacer Control Gates in a Trench*, Ser. No. 11/188,584, filed Jul. 25, 2005.

FIELD OF THE INVENTION

The invention is in the field of semiconductor devices and, more particularly, nonvolatile storage devices.

RELATED ART

Nonvolatile storage is an important element in the design of substantially all electronic devices. In the field of wireless and portable electronic devices, nonvolatile storage must be compact and consume little power. Various nonvolatile storage cells have been proposed and implemented. Included among these conventional cells are planar storage cells and storage cells employing floating gates as a charge storage element. A planar storage cell is characterized by a planar transistor channel region typically located in proximity to an upper surface of the wafer substrate. While planar technology is mature and well understood, planar devices consume an undesirably large amount of wafer area.

With respect to the charge storage element, conventional floating gates have been made of a contiguous strip of a conductive material such as polysilicon. Conductive floating gates present a problem in devices with very thin dielectrics. Thin dielectrics are particularly susceptible to pin hole defects. With a conductive floating gate, all of the stored charge on the floating gate can leak off through a single pin hole defect in the dielectric. Moreover, conventional floating gates are not suitable for localized programming in which injected electrons are confined to a specific location of the charge storage element. Localized programming offers the prospect of multiple bit storage cell, where each bit is associated with a specific region of the charge storage element. Accordingly, it would be desirable to implement a multiple bit storage device suitable for use in an advanced processes employing very thin dielectrics where the design of the implemented device consumes less area than planar devices and devices employing conventional charge storage elements.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor-based storage cell and a corresponding fabrication process employ a trench etched into a semiconductor substrate, a charge storage layer formed along the sidewalls of the trench, and a control gate spacer on the trench sidewall adjacent to the charge storage layer. The depth of the trench exceeds the spacer height so that a gap exists between the top of the spacer and the top of the trench. The gap facilitates ballistic programming of the charge storage layer adjacent to the gap. The charge storage layer preferably includes a set of discontinuous storage elements (DSEs). In this embodiment, the DSEs may be silicon nanocrystals or nanoclusters, which are small, discreet silicon structures embedded in a dielectric layer and capable of holding a positive or negative charge. Because DSEs are not physically or electrically connected to each other, DSEs are less susceptible to charge loss through pin holes in the dielectric layer than conventional storage elements such as conventional polysilicon floating gate structures. The preferred implementation of the storage device is capable of storing multiple bits of information using hot carrier injection (HCI) programming, ballistic source side injection (SSI) programming, or both.

Figure 1:
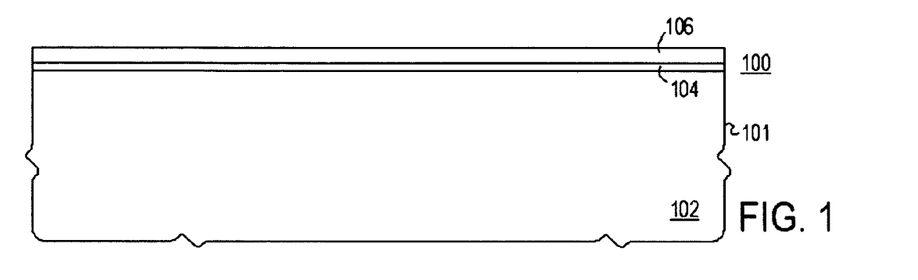
FIG. 1 is a partial cross sectional view of a wafer at an intermediate stage in a fabrication process in which a hard mask is formed on a dielectric liner over a semiconductor substrate of a wafer.

Referring to the drawings, FIG. 1 through FIG. 10 depict a set of partial cross sectional views of a semiconductor wafer at various stages in one embodiment of a process for fabricating a nonvolatile storage device 100. In FIG. 1, a dielectric liner 104 and a hard mask 106 are formed on an upper surface of a semiconductor substrate 102 of a semiconductor wafer 101. Semiconductor substrate is preferably doped or undoped monocrystalline silicon. In other embodiments, semiconductor substrate 102 may include other semiconductors such as germanium or various semiconductor alloys such as the III-V semiconductor alloys including gallium arsenide. Wafer 101 may also be a semiconductor on insulator (SOI) wafer in which semiconductor substrate 102 overlies a buried oxide (BOX) layer (not depicted).

In one embodiment, dielectric liner 104 is silicon oxide, which may be thermally formed (grown) or deposited using CVD (chemical vapor deposition). Hard mask 106 is preferably a dielectric that can be selectively etched with respect to substrate 102. Hard mask 106 is preferably CVD silicon nitride, which is desirable for its ability to inhibit oxidation of an underlying semiconductor thereby providing a mask for a thermal oxidation process.

Figure 2:
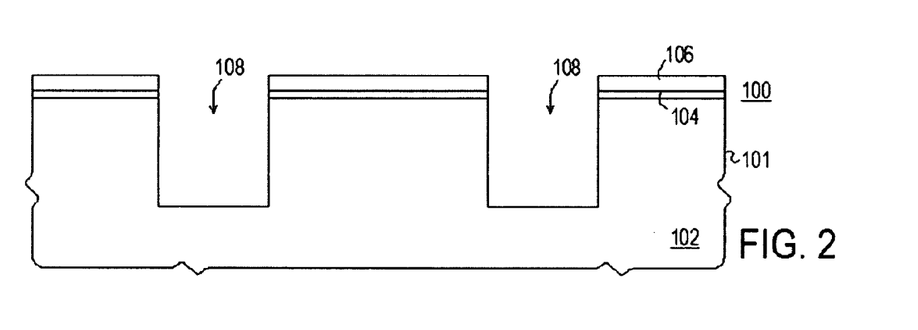
FIG. 2 depicts processing subsequent to FIG. 1 in which trenches are formed in the semiconductor substrate.

Referring now to FIG. 2, trenches 108 are formed in semiconductor substrate 102. Trenches 108 define the basic structure of the storage device to be formed. Formation of trenches 108 includes conventional photolithographic patterning of dielectric liner 104 and hard mask 106, followed by a dry etch process that etches the semiconductor material (e.g., silicon) preferentially with respect to liner 104 and hard mask 106. Etch processes of this type are well known in the field of semiconductor fabrication. In the depicted implementation, trenches 108 have an aspect of approximately 1:2. A depth of trenches 108 is an implementation detail, but trenches having a depth in the range of approximately 50 nm to 300 nm are desirable for applications requiring a dense storage array.

Figure 3:
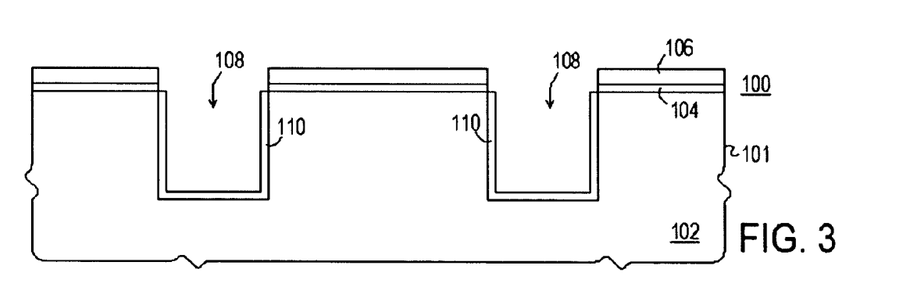
FIG. 3 depicts processing subsequent to FIG. 2 in which the trenches are lined with a bottom dielectric.

In FIG. 3, a first step in the formation of a charge storage stack includes the formation of a dielectric, referred to herein as bottom dielectric 110, on the sidewalls and floor of trenches 108. Bottom dielectric 110 is preferably a thin (e.g., 1 nm to 10 nm) high quality dielectric that is employed in the programming and erasing of DSEs that will be formed subsequently. A thin dielectric is required to achieve adequate programming times using either injection-based or tunneling-based programming techniques. A high quality dielectric is required to withstand the potentially large programming voltages and currents and the potentially large number of programming cycles without exhibiting breakdown or significant leakage. In the preferred embodiment, bottom dielectric 110 is a thermally formed silicon dioxide film having a thickness in the range of approximately 4 to 10 nm. As depicted in FIG. 3, where hard mask 106 is a silicon nitride hard mask, thermal oxidation of the trench walls does not substantially increase the thickness of dielectric liner 104 even for embodiment in win dielectric liner 104 is a silicon oxide.

Figure 4:
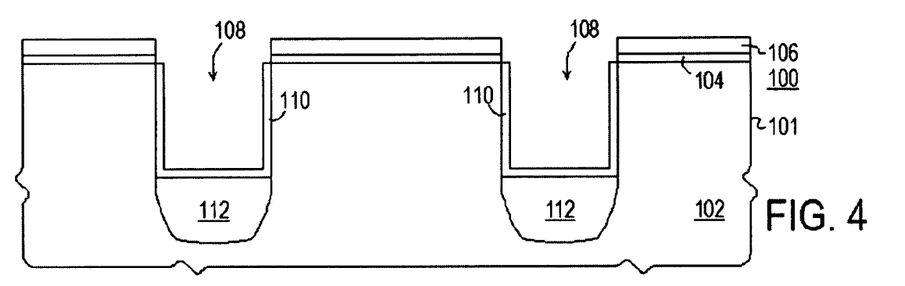
FIG. 4 depicts processing subsequent to FIG. 3 in which source/drain regions are formed underlying the trenches.

In FIG. 4, source/drain regions 112 are formed underlying trenches 108. Source/drain regions 112 are electrically conductive, heavily-doped regions having a conductivity type opposite to a conductivity type of semiconductor substrate 102. For an embodiment employing NMOS storage devices, for example, semiconductor substrate is preferably a lightly doped p-type (p−) silicon and source/drain regions 112 are heavily doped n-doped (n+) silicon having an impurity distribution in excess of $1e18$ $cm^{-3}$. In one embodiment, source/drain regions 112 are buried diffusion regions formed by implanting an impurity into substrate 102 underlying trenches 108 and thereafter performing a diffusion step. In other embodiments, the implantation step may be omitted to preserve the integrity of bottom oxide 110.

Figure 5:
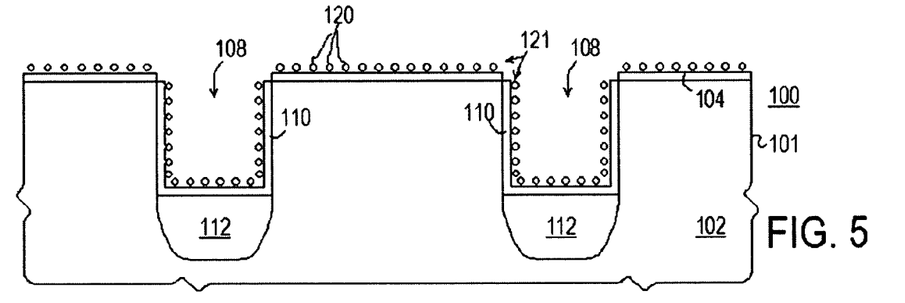
FIG. 5 depicts processing subsequent to FIG. 4 in which the hard mask is removed and a layer of discontinuous storage elements is deposited.

In FIG. 5, hard mask 106 has been removed and a charge storage layer 121 has been non-selectively formed on bottom oxide 110 and an upper surface of dielectric liner 104. Charge storage layer 121 represents the structure in or on which charge will be stored to program the bit or bits of storage device 100. In the depicted embodiment, charge storage layer 121 includes a plurality of DSEs 120. DSEs 120 (sometimes referred to as nanocrystals) are a set of discreet accumulations of a material capable of storing a charge. Suitable materials include silicon, polysilicon, other semiconductors, metals such as titanium, tungsten, tantalum, aluminum, copper, platinum, and the like, and dielectrics such as silicon nitride or silicon oxynitride.

In the preferred implementation, DSEs 120 are silicon DSEs (silicon nanocrystals). In this implementation, DSEs 120 may be formed in any one of a variety of ways, preferably without requiring any photolithography steps. One well-known DSE formation technique is to deposit an amorphous silicon layer and heat it to form the nanocrystals. Another technique is to deposit the nanocrystals using chemical vapor deposition (CVD). DSEs may have various shapes, including hemispherical and spherical, depending upon the deposition technique employed. In one implementation, DSEs 120 are approximately 10 nm in diameter and are spaced at a predominantly uniform spacing of approximately 10 nm. Regardless of the formation technique used, each DSE 120 is a particle of silicon that is electrically and physically isolated from its neighbors.

Figure 6:
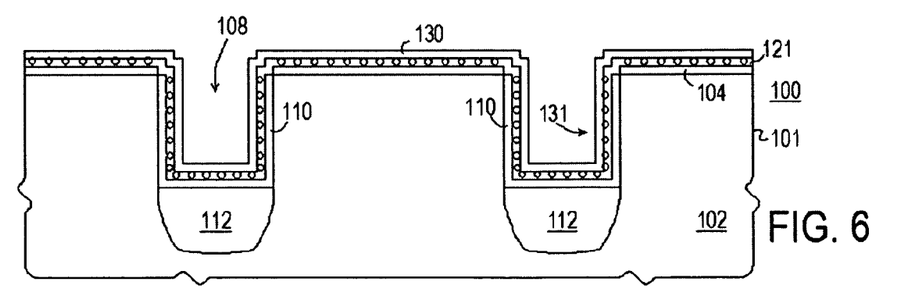
FIG. 6 depicts processing subsequent to FIG. 5 in which a top dielectric is formed on the layer of discontinuous storage elements to form a charge storage stack.

Referring to FIG. 6, a top dielectric 130 has been non-selectively formed overlying charge storage layer 121 to complete the formation of charge storage stack 131, which includes bottom dielectric 110, charge storage layer 121 (FIG. 4), and top dielectric 130. In the preferred embodiment, top dielectric 130 is a high temperature oxide (HTO) desirable because it exhibits characteristics (e.g., density and dielectric strength) substantially equivalent to thermally formed silicon dioxide. In this embodiment, the HTO may be formed by a conventional HTO process such as reacting dichlorosilane and nitrous oxide at temperatures approaching 900 C. In other embodiments, it may be desirable to employ a lower temperature process (e.g., a TEOS (tetraethylorthosilicate) process) to guard against unintended oxidation of the silicon embodiments of DSEs 120. Top dielectric 130 may also be composed of other dielectrics such as aluminum oxide, hafnium oxide, or other dielectrics with a high dielectric constant. Top dielectric layer 130 may be composed of multiple layers of differing dielectric materials. A thickness of top dielectric 130 is preferably in the range of approximately 5 to 15 nm.

Figure 7:
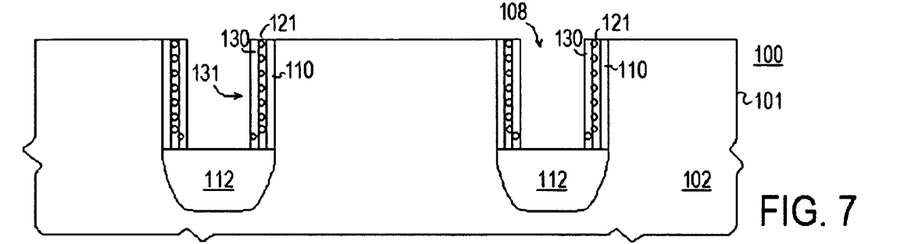
FIG. 7 depicts processing subsequent to FIG. 6 in which portions of the charge storage stack are removed to expose portions of the substrate.

Turning now to FIG. 7, portions of the charge storage stack layers are selectively removed from horizontal surfaces of the wafer including the upper surface of substrate 102 and the floor of trench 108 so that the charge storage stack 131 remains on sidewalls of trench 108. In one embodiment, removal of the charge storage stack layers from the horizontal surfaces includes performing an anisotropic oxide etch according to known processing techniques. Removal of the charge storage stack layers exposes portions of semiconductor substrate 102 between the trenches 108 and at the floors of trenches 108.

Figure 8:
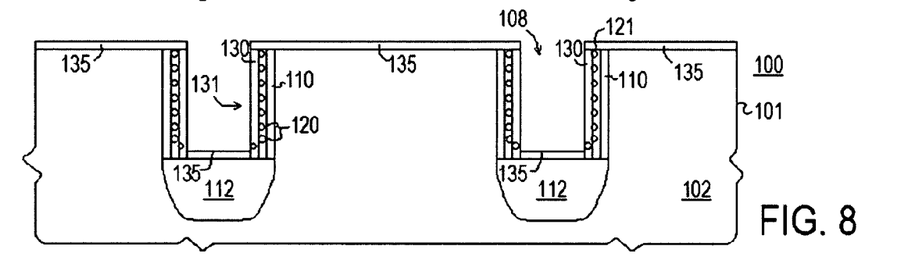
FIG. 8 depicts processing subsequent to FIG. 7 in which a dielectric is formed on exposed portions of the substrate.

In FIG. 8, a dielectric layer 135 is grown or otherwise formed on the exposed surfaces of substrate 102. Dielectric layer 135 may be a thermally formed silicon dioxide, a deposited oxide, an alternative dielectric such as silicon nitride or silicon oxynitride, or a combination thereof. A CVD embodiment of dielectric layer 135 may be preferred to a thermal oxide to prevent unwanted oxidation of DSEs 120. On the other hand, a thermal oxide may be preferred to prevent an unwanted increase in the thickness of top oxide 130.

Figure 9:
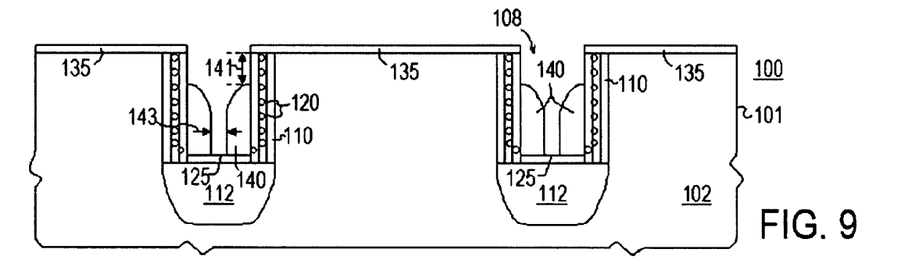
FIG. 9 depicts processing subsequent to FIG. 8 in which spacer control gates are formed on sidewalls of the trenches.

Turning now to FIG. 9, storage device control gates are formed on sidewalls of trenches 108. In the depicted embodiment, control gates 140 are implemented as spacers, which are formed by a conventional spacer formation process in which a conformal film is deposited and then anisotropically etched. Control gates 140 are electrically conductive structures used in the programming and erasing of the storage device. In one embodiment, control gates 140 are conventional polysilicon formed by thermal decomposition of silane according to well known semiconductor fabrication techniques. In the depicted implementation, the control gate spacers on opposing sidewalls of trench 108 are distinct structures separated by a spacing indicated by reference numeral 143. In this embodiment, each control gate spacer 140 may be biased independently. In other embodiments (not depicted), control gate spacers 140 on opposing sidewalls may merge in the middle to form a single control gate structure.

In the depicted embodiment, a depth of trenches 108 exceeds a height of control gate spacers 140 by controlling the duration of the spacer etch so that spacers 140 extend only partially up the sidewalls of trenches 108. In this embodiment, a gap 141 exists between the top of spacers 140 and the upper surface of substrate 102. Gap 141 is adjacent to a portion of the DSEs 120 in charge storage stack 131. When the storage device is biased appropriately, an high magnitude electric field exists within substrate 102 in the vicinity of gap 141. The acceleration of electrons caused by this field may result in ballistic programming of the DSEs 120 adjacent to gap 141. This ballistic programming is facilitated by the geometrical arrangement of the storage device wherein electrons flow in a direction that is substantially perpendicular to the sidewalls of trench 108 as will be described in greater detail below.

Figure 10:
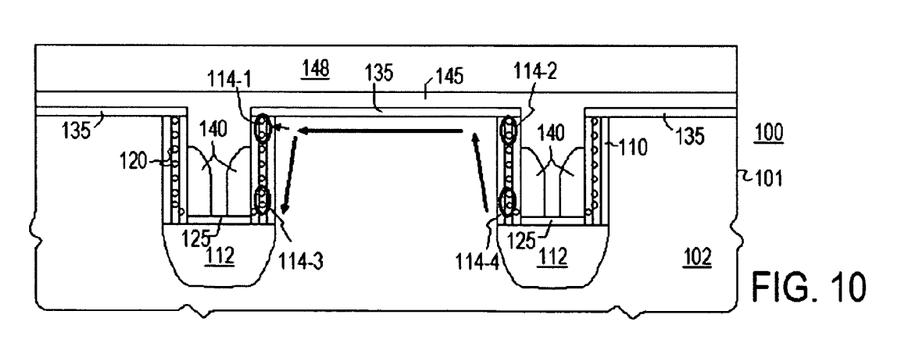
FIG. 10 depicts processing subsequent to FIG. 9 in which an isolation dielectric and a select gate layer are formed.

Referring now to FIG. 10, an isolation dielectric 145 is formed non-selectively to fill trenches 108. Isolation dielectric is preferably a CVD oxide using a conventional source such as a TEOS source. In the depicted implementation, isolation dielectric 145 is deposited to a thickness sufficient to form a dielectric film on the upper surface of substrate 102. Formation of isolation dielectric 145 may include, in addition to a deposition process, a planarization process such as an etchback or a chemical mechanical polish (CMP).

Following the formation of isolation dielectric 145, a select gate 148 is formed overlying the dielectric. Select gate 148 as shown in FIG. 10 is a continuous select line that traverses the trenches 108 and the underlying source/drain regions 112. Select gate 148 is an electrically conductive material such as polysilicon, aluminum, copper, alloys thereof, or the like fabricated using conventional deposition and patterning techniques.

As depicted in FIG. 10, storage device 100 includes four independently programmable injection regions 114-1 through 114-4. Each injection region 114 encompasses a corresponding portion of DSEs 120. More specifically, each injection region 114 represents a region of DSEs 120 on which charge is stored to program a corresponding bit of information. Thus, as depicted in FIG. 10, storage device 100 include four programmable bits of information.

Figure 13:
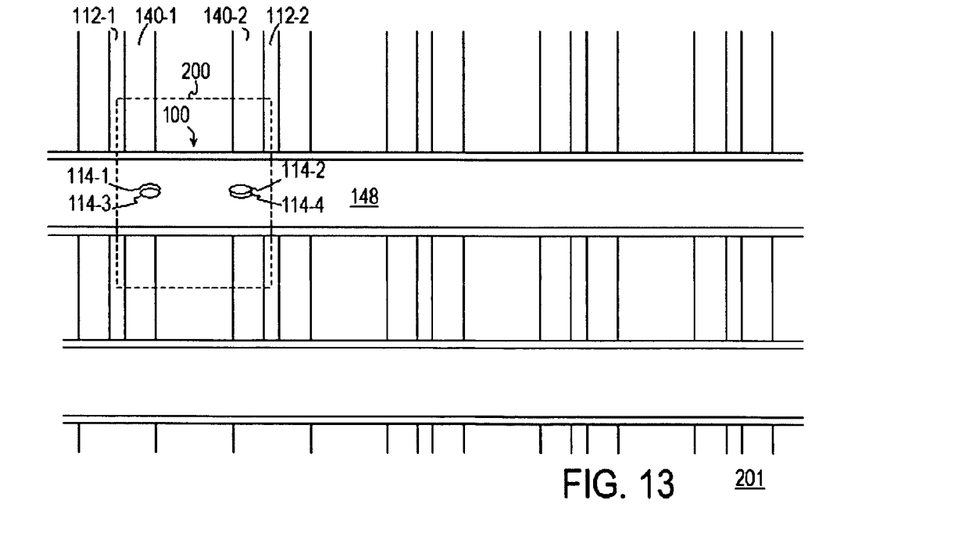
FIG. 13 is a top view of an array of storage cells comprised of the storage device of FIG. 10.

A top view of storage device 100 depicted in FIG. 13 emphasizes storage device 100 as part of an array 201 of storage cells 200. In the depicted embodiment, storage cell 200 encompasses a single storage device 100, which includes a pair of parallel source/drain regions 112 underlying trenches 108 (see FIG. 9) formed in semiconductor substrate 102. Sidewalls of trenches 108 are lined with a charge storage stack 131 (not shown seen in the top view of FIG. 13). Control gate spacers 140 are formed on the trench sidewalls. A continuous select gate 148 overlies an isolation dielectric and traverses control gate spacers 140 and source/drain regions 112-1 and 112-2. Contacts to source/drain regions 112 and control gates 140 are preferably made outside of the array 201. The injection regions 114-1 through 114-4 shown in FIG. 10 are seen in FIG. 13 positioned at the edge of source/drain regions 112. In this top view, injection region 114-1 is positioned overlying injection region 114-3 and injection region 114-2 is positioned overlying injection region 114-4.

Storage device 100 includes a pair of injection regions 114-1 and 114-2 programmable using ballistic source side injection (SSI) programming and a pair of regions 114-3 and 114-4 programmable using hot carrier injection (HCI). Programming table 160 of FIG. 16 indicates biasing conditions for programming ballistic SSI injection regions 114-1 and 114-2. The programming conditions listed are for NMOS embodiments of storage device 100. Opposite polarities apply for PMOS embodiments.

Figure 16:
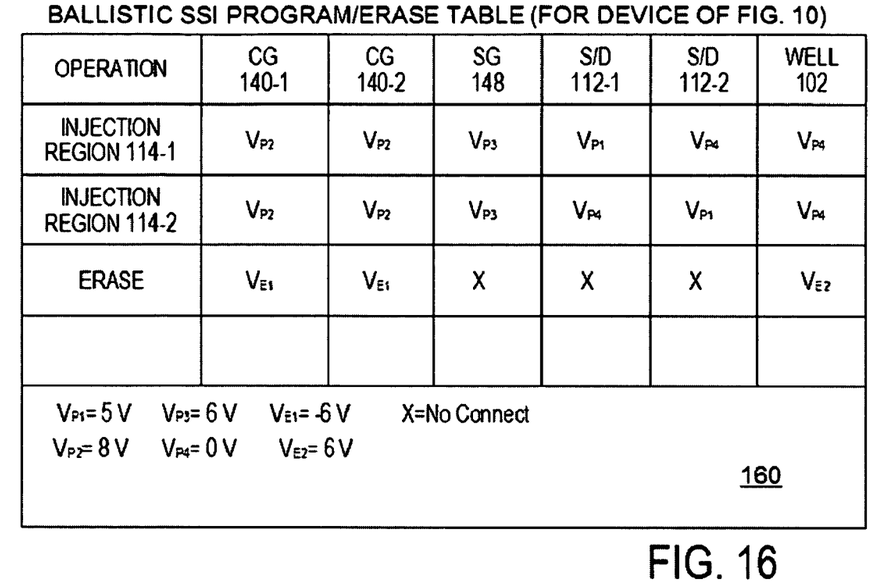
FIG. 16 is a programming table for the ballistic source side injection regions of the storage device of FIG. 10.

Programming a first bit that is associated with ballistic SSI injection 114-1 includes biasing source/drain region 112-1 to a first programming voltage ($V_{P1}$), biasing control gate 140 to a second programming voltage ($V_{P2}$), biasing continuous select gate 148 to a third programming voltage ($V_{P3}$), biasing source/drain region 112-2 and substrate 102 to a fourth programming voltage ($V_{P4}$). For one NMOS embodiment of storage cell 100, $V_{P1}$ (source/drain programming voltage), $V_{P2}$, control gate programming voltage, and $V_{P3}$ (select gate programming) are all in the range of approximately 5 V to 9 V while $V_{P4}$ is 0 V (ground).

Figure 17:
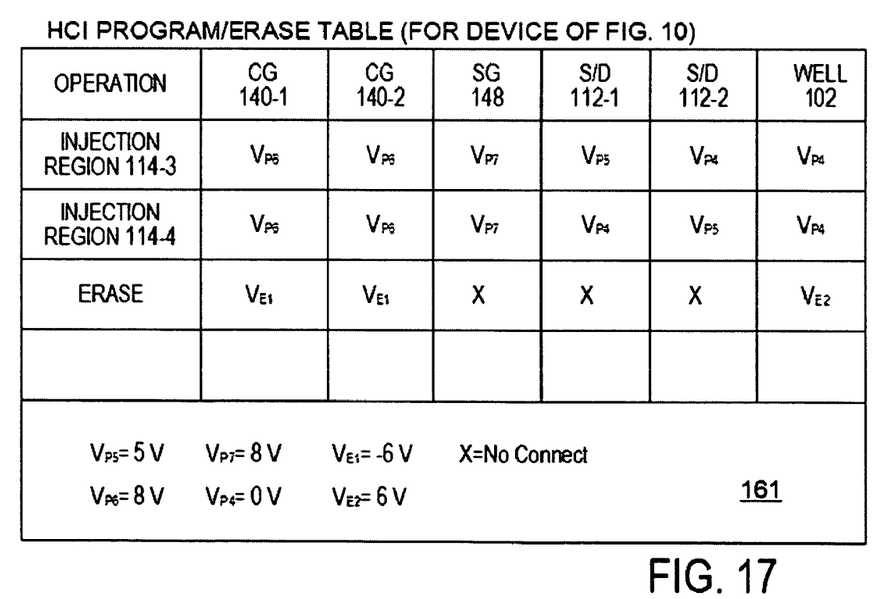
FIG. 17 is a programming table for the hot carrier injection regions of the storage device of FIG. 10.

Exemplary programming values are depicted in FIG. 16. These biasing conditions are preferably applied to storage device 100 for a specified duration, which is preferably on the order of microseconds. Under these biasing conditions, electrons flow from source/drain region 112-2 to source/drain region 112-1, following a path suggested by the arrows in FIG. 10. As these electrons approach the portion of source/drain region 112-1 adjacent to gap 141, the electric field attributable to the gap increases. The increased electric field causes a portion of the electron to collide with the sidewalls of trench 108. Some of the electrons that collide with the trench sidewall will program the DSEs adjacent to gap 141. Ballistic SSI injection region 114-2 is programmed by biasing source/drain region 112-2 to $V_{P1}$, control gate 140-2 to $V_{P2}$, select gate 148 to $V_{P3}$, and source/drain region 112-1 and semiconductor substrate 102 to $V_{P4}$. Storage device 100 as depicted in FIG. 10 further includes a pair of HCI injection regions 114-3 and 114-4. Programming table 161 of FIG. 17 indicates the biasing conditions required to program the bits associated with these injection regions. Specifically, programming HCI injection region 114-3 includes biasing source/drain region 112-1 to a fifth programming voltage ($V_{P5}$), control gate 140-1 to a sixth programming voltage $V_{P6}$, and select gate 148 to a seventh programming voltage $V_{P7}$, and source/drain region 112-2 and substrate 102 to $V_{P4}$. Programming HCI injection region 114-4 includes biasing source/drain region 112-2 to $V_{P5}$, control gate 140-2 to $V_{P6}$, select gate 148 to $V_{P7}$, and source/drain region 112-1 and substrate 102 to $V_{P4}$. In one embodiment, $V_{P5}$ is in the range of approximately 5 to 9 V, $V_{P6}$ is in the range of approximately 6 to 9 V and $V_{P7}$ is in the range of approximately 3 to 8 V. Exemplary voltages are indicated in table 161. In some embodiments, a positive source to well voltage during may be applied during program.

Erasing the programmed injecting region includes biasing the first and second control gates to a first erase voltage ($V_{E1}$) and biasing the semiconductor substrate to a second erase voltage ($V_{E2}$). The select gates 148 may be biased to $V_{E1}$ during erase to insure complete erase. In addition, erase can be accomplished in either polarity. Thus, for example, $V_{E1}$ can be +/−6V, while $V_{E2}$ is −/+6V. The erase conditions apply to each of the programming tables.

Figure 11:
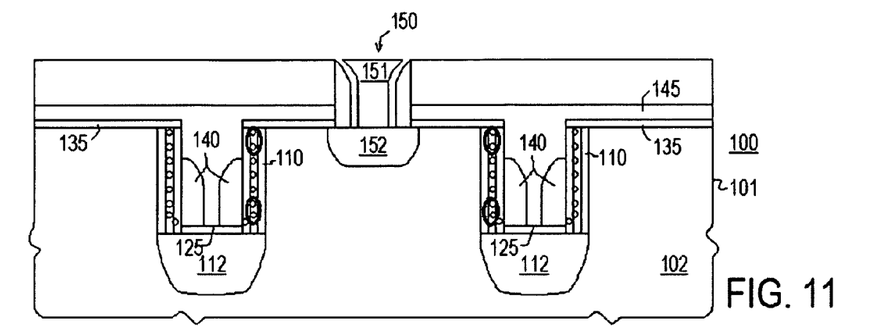
FIG. 11 depicts processing subsequent to FIG. 10 according to an embodiment in which a contact terminating the continuity of the select gate layer is formed between the trenches.
Figure 14:
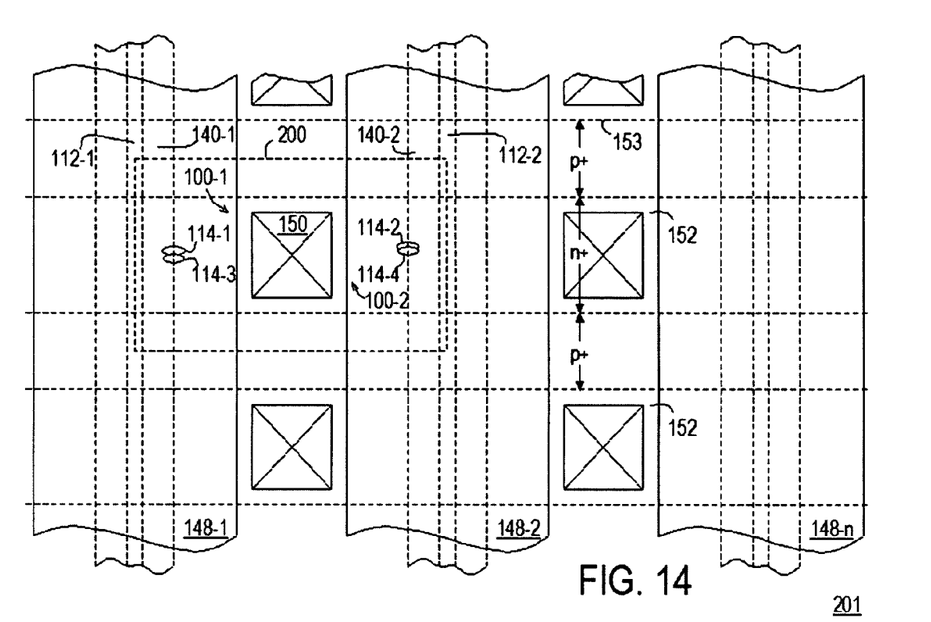
FIG. 14 is a top view of an array of storage cells comprised of the storage device of FIG. 11.

A second embodiment of a storage cell 200 is depicted in the cross section of FIG. 11 and the top view of FIG. 14. This embodiment includes a contact 150 to a diffusion region 152 formed between adjacent trenches 108. In this embodiment, select gates 148-1, 148-2, through 148-n run parallel to control gates 140 and source/drain regions 112 rather than perpendicular to control gates 140 as in the embodiment of FIG. 10. In this configuration, storage cell 200 includes two storage devices 100-1 and 100-2, each of which may program two injection regions to store two bits of information (four unique states). Diffusion region 152 is of the same conductivity type as source/drain regions 112 (e.g., n-type for NMOS embodiments) and may serve as a source/drain for either device. Isolation between adjacent diffusion regions 152 is provided by "striped" regions of p-type substrate (for implementations in which diffusion regions 152 are n-type). A striped mask 153 is used to a implant a first type of dopant (e.g. n-type) into diffusion regions 152 (which are also masked in the array such that they are self-aligned to select gate 148) and a second type of dopant (e.g, p-type) between diffusion regions 152 row. In this manner, neighboring diffusion regions 152 are isolated from one another from row to row by a region of opposite doping polarity of suitable concentration to prevent inversion between neighboring rows during the program or read operations. First storage device 100-1 includes control gate 140-1, source/drain region 112-1, select gate 148-1, and diffusion region 152. Second storage device 100-2 includes control gate 140-2, source/drain regions 112-2, select gate 148-2, and diffusion region 152.

Figure 22:
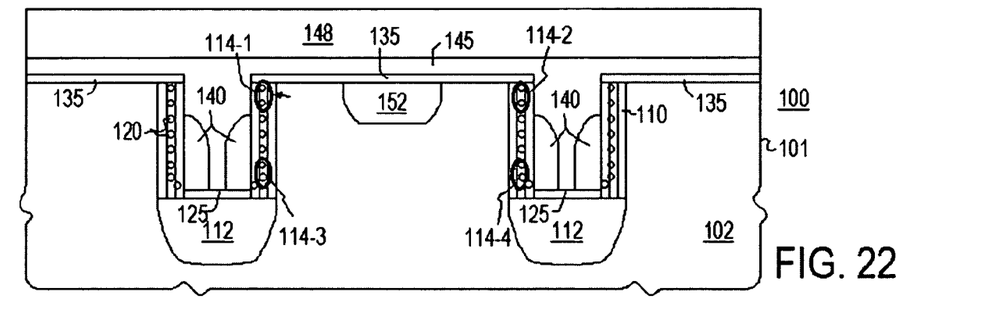
FIG. 22 is a top view of an alternative implementation to the embodiment depicted in FIG. 11.

A virtual ground array variation of the embodiment depicted in FIG. 11 is depicted in FIG. 22. In this configuration, the contact 150 to diffusion region 152 is eliminated within the array and diffusion region 152 is a continuous region that extends across the entire array parallel to source/drain regions 112 and control gates 140. Contact to diffusion region 152 (not shown) is made outside of the cell array. This configuration also eliminates the need to implement the striped isolation 153 shown in FIG. 14. The virtual ground array configuration of FIG. 22 is desirable for its potential for increased density resulting from the elimination of the contact in the array.

Figure 18:
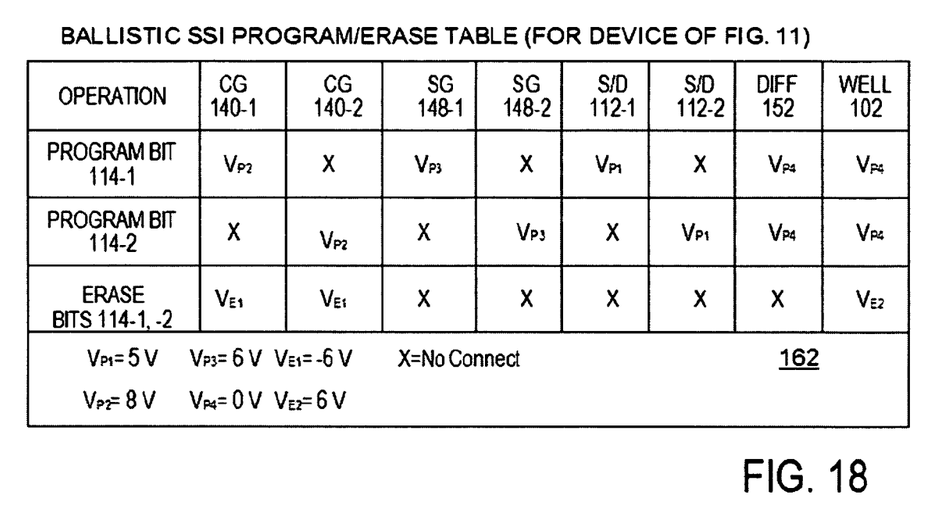
FIG. 18 is a programming table for the ballistic source side injection regions of the storage device of FIG. 11.

Programming table 162 of FIG. 18 indicates the biasing required to program the ballistic SSI injection regions 114-1 and 114-2 for the embodiment of storage cell 200 depicted in FIG. 11 and FIG. 14. Programming ballistic SSI injection region 114-1 of storage device 100-1 includes biasing source/drain region 112-1 to $V_{P1}$, control gate 140-1 to $V_{P2}$, select gate 148-1 to $V_{P3}$, and diffusion region 152 and substrate 102 to $V_{P4}$. Programming ballistic SSI injection region 114-2 of storage device 100-2 is achieved by biasing source/drain region 112-2 to $V_{P1}$, control gate 140-2 to $V_{P2}$, select gate 148-2 to $V_{P3}$, and diffusion region 152 and substrate 102 to $V_{P4}$.

Figure 19:
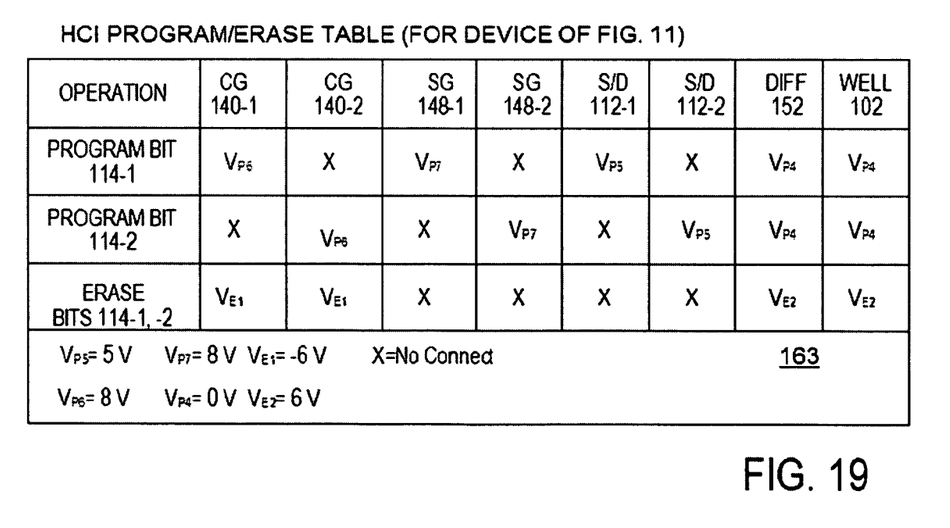
FIG. 19 is a programming table for the hot carrier injection regions of the storage device of FIG. 11.

Programming table 163 of FIG. 19 indicates the biasing conditions for programming the HCI injection regions 114-3 and 114-4 of storage cell 200 as shown in FIG. 11. HCI injection region 114-3 of storage device 100-1 is programmed by biasing source/drain region 112-1 to $V_{P5}$, control gate 140-1 to $V_{P6}$, select gate 148-1 to $V_{P7}$, and diffusion region 152 and substrate 102 to $V_{P4}$. HCI injection region 114-4 of storage device 100-2 is programmed by biasing source/drain region 112-2 to $V_{P5}$, control gate 140-2 to $V_{P6}$, select gate 148-2 to $V_{P7}$, and diffusion region 152 and substrate 102 to $V_{P7}$.

Figure 12:
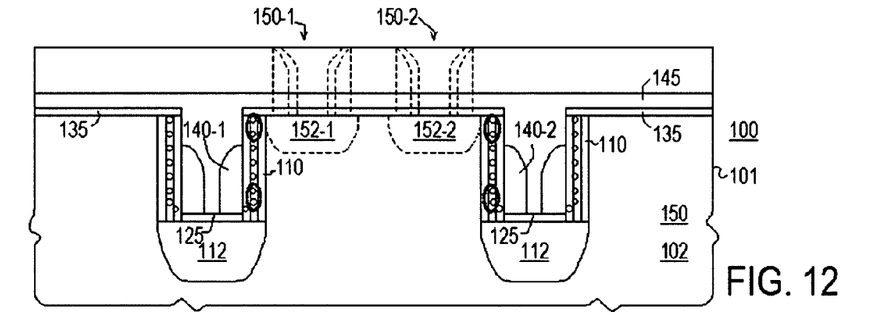
FIG. 12 depicts processing subsequent to FIG. 10 according to an embodiment in which staggered contacts are formed on either side of the select gate layer.
Figure 15:
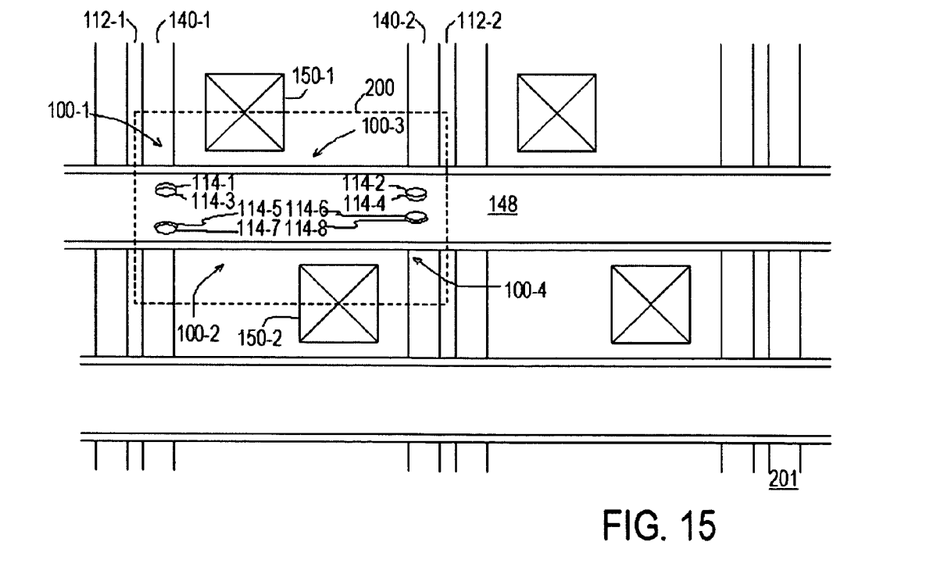
FIG. 15 is a top view of an array of storage cells comprised of the storage device of FIG. 12.

A third embodiment of storage cell 200 is depicted in the cross section of FIG. 12 and the top view of FIG. 15. In this embodiment, storage cell 200 includes a pair of "staggered" contacts 150-1 and 150-2 where contact 150-1 is positioned on a first side of a continuous select gate 148 and contact 150-2 is positioned on the other side of select gate 148. Contacts 150-1 and 150-2 contact respective diffusion regions 152-1 and 152-2 within substrate 102. Like diffusion region 152 in FIG. 11, the conductivity type of diffusion regions 152-1 and 152-2 is opposite the conductivity type of substrate 102 and the same conductivity type as source/drain regions 112-1 and 112-2.

This embodiment of storage cell 200 includes four storage devices 100-1 through 100-4. Storage device 100-1 includes select gate 148, control gate 140-1, source/drain region 112-1, and diffusion region 152-1 under contact 150-1. Storage device 100-2 includes select gate 148, control gate 140-1, source/drain region 112-1, and diffusion region 152-2 under contact 150-2. Storage device 100-3 includes select gate 148, control gate 140-2, source/drain region 112-2, and diffusion region 152-1 under contact 150-1. Storage device 100-4 includes select gate 148, control gate 140-2, source/drain region 112-2, and diffusion region 152-2 under contact 150-2.

In the depicted embodiment of storage cell 200, contacts 150-1 and 150-2 are arranged in a diagonal configuration with contact 150-1 being closer to source/drain region 112-1 and contact 150-2 being closer to source/drain region 112-2. This embodiment simplifies the design of back end metalization (not depicted) that will connect to the contact structures. In another embodiment (not shown) desirable for its symmetrical design, contacts 150-1 and 150-2 are arranged in a straight line fashion with both contacts being equidistant from source/drain regions 112-1 and 112-2.

Each storage device 100-1 through 100-4 has two programmable injection regions, a ballistic SSI injection region and an HCI injection region. By including contacts on opposing sides of select gate 148, this third embodiment is able to program two ballistic SSI injection regions and two HCI injection regions within a single charge storage stack 131 where one of the injection regions is closer to first contact 150-1 and the other is closer to second contact 150-2.

Figure 20:
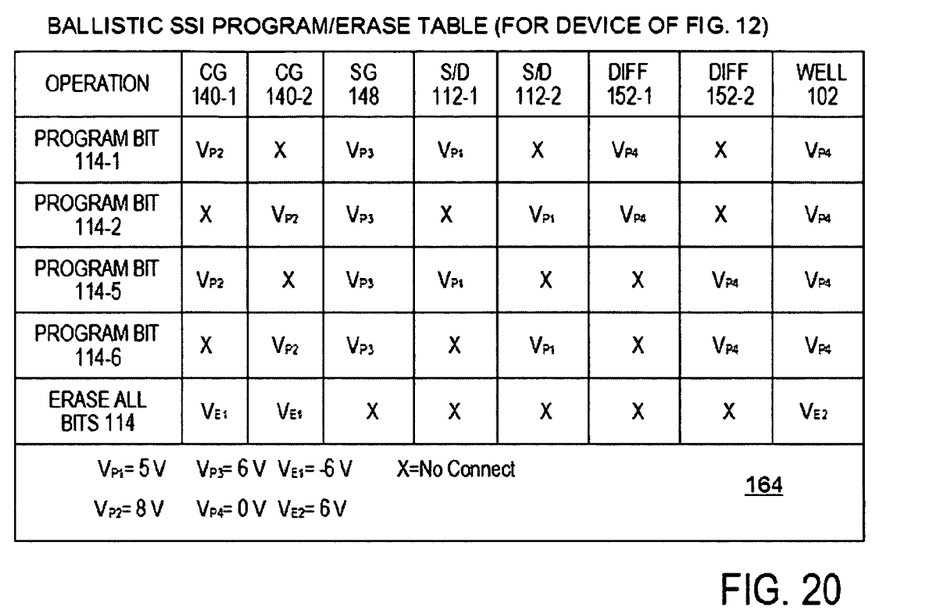
FIG. 20 is a programming table for the ballistic source side injection regions of the storage device of FIG. 12.

Programming table 164 of FIG. 20 indicates programming conditions for the ballistic SSI injection regions 114-1, 114-2, 114-5, and 114-6 for the embodiment of storage cell 200 depicted in FIG. 12 and FIG. 15. Programming ballistic SSI injection region 114-1 of storage device 100-1 includes biasing source/drain region 112-1 to $V_{P1}$, control gate 140-1 to $V_{P2}$, select gate 148 to $V_{P3}$, and diffusion region 152-1 and substrate 102 to $V_{P4}$ while control gate 140-2, source/drain region 112-2, and diffusion region 152-2 are left floating (indicated by an X in table 164). Programming ballistic SSI injection region 114-2 of storage device 100-3 includes biasing source/drain region 112-2 to $V_{P1}$, control gate 140-2 to $V_{P2}$, select gate 148 to $V_{P3}$, diffusion region 152-1 and substrate 102 to $V_{P4}$, and floating control gate 140-1, source/drain region 112-2, and diffusion region 152-2. SSI injection region 114-5 of storage device 100-2 is programmed by biasing source/drain region 112-1 to $V_{P1}$, control gate 140-1 to $V_{P2}$, select gate 148 to $V_{P3}$, diffusion region 152-2 and substrate 102 to $V_{P4}$, and floating control gate 140-2, source/drain region 112-2, and diffusion region 152-1. SSI injection region 114-6 of storage device 100-4 is programmed by biasing source/drain region 112-2 to $V_{P1}$, control gate 140-2 to $V_{P2}$, select gate 148 to $V_{P3}$, diffusion region 152-2 and substrate 102 to $V_{P4}$, and floating control gate 140-1, source/drain region 112-1, and diffusion region 152-1.

Figure 21:
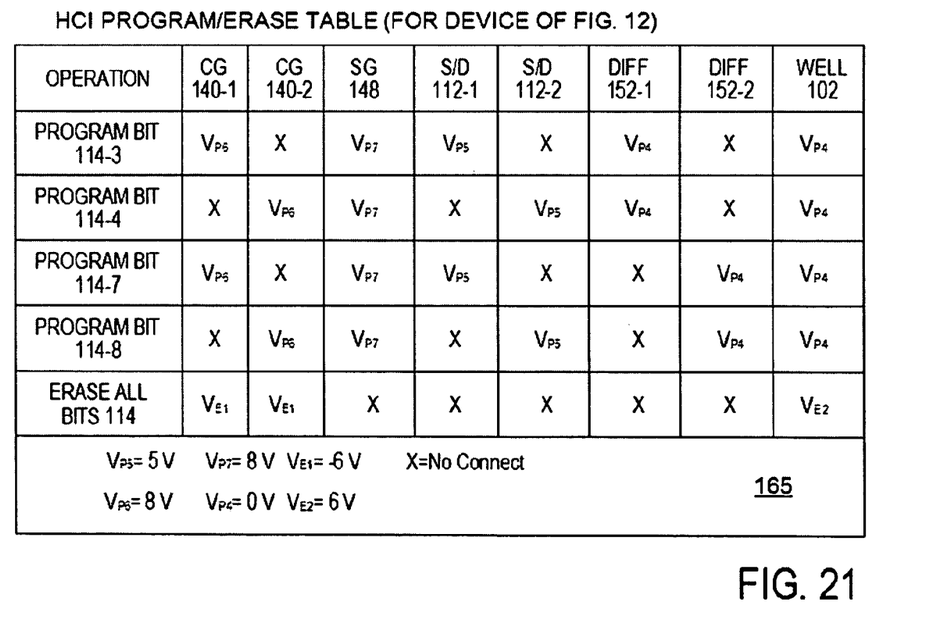
FIG. 21 is a programming table for the hot carrier injection regions of the storage device of FIG. 12.

Programming table 165 of FIG. 21 indicates programming conditions for HCI injection regions 114-3, 114-4, 114-7, and 114-8 for the storage cell 200 of FIG. 12 and FIG. 15. Programming HCI injection region 114-3 of storage device 100-1 includes biasing source/drain region 112-1 to $V_{P5}$, control gate 140-1 to $V_{P6}$, select gate 148 to $V_{P7}$, diffusion region 152-1 and substrate 102 to $V_{P4}$, and floating control gate 140-2, source/drain region 112-2, and diffusion region 152-2. Programming HCI injection region 114-4 of storage device 100-3 includes biasing source/drain region 112-2 to $V_{P5}$, control gate 140-2 to $V_{P6}$, select gate 148 to $V_{P7}$, diffusion region 152-1 and substrate 102 to $V_{P7}$, and floating control gate 140-1, source/drain region 112-1, and diffusion region 152-2. Programming HCI injection region 114-7 of storage device 100-2 includes biasing source/drain region 112-1 to $V_{P5}$, control gate 140-1 to $V_{P6}$, select gate 148 to $V_{P7}$, diffusion region 152-2 and substrate 102 to $V_{P4}$, and floating control gate 140-2, source/drain region 112-2, and diffusion region 152-1. Programming HCI injection region 114-8 of storage device 100-4 includes biasing source/drain region 112-2 to $V_{P5}$, control gate 140-2 to $V_{P6}$, select gate 148 to $V_{P7}$, diffusion region 152-2 and substrate 102 to $V_{P4}$, and floating control gate 140-1, source/drain region 112-1, and diffusion region 152-1.

In the foregoing specification, the invention has been described with reference to specific embodiments. However, one of ordinary skill in the art appreciates that various modifications and changes can be made without departing from the scope of the present invention as set forth in the claims below. For example, although the depicted embodiment is an NMOS transistor embodiment, PMOS embodiments are equally encompassed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of fabricating a storage device in an array of storage devices, comprising:
   forming first and second trenches in a semiconductor substrate;
   forming first and second source/drain regions underlying the first and second trenches respectively;
   lining sidewalls of the first and second trenches with a charge storage stack, wherein the charge storage stacks include a layer of discontinuous storage elements (DSEs) formed on a bottom oxide;
   forming spacer control gates in the first and second trendhes adjacent to the charge storage stacks, wherein a depth of the first and second trenches is greater than a height of the spacer control gates;
   forming an isolating dielectric; and
   forming a select gate overlying the isolating dielectric and the first trench.

2. The method of claim 1, wherein lining sidewalls of the first and second trenches includes lining the first and second trenches and an upper surface of the semiconductor substrate with a charge storage stack and anisoiropically etching the charge storage stack to remove portions of the charge storage stack from horizontal surfaces.

3. The method of claim 1, wherein the layer of DSEs comprises a layer of silicon nanocrystals.

4. The method of claim 3, wherein lining the sidewalk includes growing the bottom oxide using thermal oxidation.

5. The method of claim 4, wherein the charge storage stack includes a top oxide adjacent to the layer of DSEs and wherein the top oxide is formed by depositing a high temperature oxide on the DSEs.

6. The method of claim 1, further comprising, prior to forming the spacer control gates, removing the charge storage stack from horizontal surfaces of the semiconductor substrate and forming a dieleciric layer on floors of the first and second trenches.

7. The method of claim 6, wherein forming the spacer control gates comprises forming polysilicon spacer control gates.

8. The method of claim 1, wherein forming the select gate comprises forming a continuous select gate perpendicular and traversing the first and second trenches.

9. The method of claim 8, further comprising forming a first diffusion region occupying an upper portion of the semiconductor substrate between the first and second trenches.

10. The method of claim 9, further comprising forming a second diffusion region occupying an upper portion of the semiconductor substrate between the first and second trenches wherein the first diffusion region is located on a first side of the select gate and the second diffusion region is on a second side of the select gate.

11. The method of claim 10, further comprising forming contacts within the array to the first and second diffusion regions.

12. The method of claim 1, wherein forming the select gate comprises forming a select gate overlying and running parallel tote first and second trenches.

13. The method of claim 12, further comprising forming a diffusion region occupying an upper portion of the semiconductor substrate between the first and second trenches.

14. The method of claim 13, further comprising forming isolation regions bordering opposing sides of the diffusion region.

15. The method of claim 14, wherein forming the isolation regions comprises forming regions of semiconductor substrate having conductivity type opposite of the conductivity type of the diffusion region.

16. The method of claim 13, wherein forming the diffusion region comprises forming a continuous diffusion region extending across the may and further comprising forming a contact to the diffusion region outside of the array.

17. The method of claim 1, wherein forming the isolating dielectric comprises depositing a dielectric to fill the first and second trenches and to form a dielectric film on an upper surface of the semiconductor substrate.

18. A method of fabricating a storage device, comprising:
   forming a trench in a semiconductor substrate;
   forming a first source/drain region underlying the trench, wherein the first source/drain region is at least as wide as the trench;
   lining the trench sidewall with a layer of discontinuous storage elements (DSEs);
   forming a first control gate in the trench adjacent to the layer of DSEs, wherein a depth of the trench exceeds a height of the first control gate resulting in a gap over the first control gate between a top of the first control gate and a top of the semiconductor substrate;
   forming an isolating dielectric over the first control gate; and
   forming a first select gate overlying the trench.

19. The method of claim 18, wherein forming the first control gate comprises forming the first control gate parallel to the trench.

20. The method of claim 18, wherein forming the first control gate comprises forming the first control gate perpendicular to the trench.

* * * * *

UNITED STATES PATENT AND TRADEMARK OFFICE
CERTIFICATE OF CORRECTION

PATENT NO. : 7,250,340 B2
APPLICATION NO. : 11/188584
DATED : July 31, 2007
INVENTOR(S) : Craig T. Swift and Gowrishankar L. Chindalore It is certified that error appears in the above-identified patent and that said Letters Patent is hereby corrected as shown below:

Column 10, Line 33 Replace the word "anisoiropically" with --anisotropically--

Column 10, Line 38 Replace the word "sidewalk" with --sidewalls--

Column 10, Line 47 Replace the word "dieleciric" with --dielectric--

Column 11, Line 3 Replace the word "tote" with --to the--

Column 11, Line 16 Replace the word "may" with --array--

Signed and Sealed this

Ninth Day of March, 2010

David J. Kappos
*Director of the United States Patent and Trademark Office*